(12) United States Patent
Lee et al.

(10) Patent No.: US 10,395,972 B2
(45) Date of Patent: Aug. 27, 2019

(54) SEMICONDUCTOR DEVICE AND MANUFACTURING METHOD THEREOF

(71) Applicant: MagnaChip Semiconductor, Ltd., Cheongju-si (KR)

(72) Inventors: Da Soon Lee, Cheongju-si (KR); Hyung Suk Choi, Cheongju-si (KR); Jeong Gyu Park, Cheongju-si (KR); Gil Ho Lee, Cheongju-si (KR); Hyun Tae Jung, Cheongju-si (KR); Meng An Jung, Cheongju-si (KR); Woo Sig Min, Cheongju-si (KR); Pil Seung Kang, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/872,747

(22) Filed: Jan. 16, 2018

(65) Prior Publication Data

US 2018/0166322 A1    Jun. 14, 2018

Related U.S. Application Data

(63) Continuation of application No. 14/067,335, filed on Oct. 30, 2013, now Pat. No. 9,922,865.

(30) Foreign Application Priority Data

Mar. 29, 2013    (KR) ........................ 10-2013-0034805

(51) Int. Cl.
*H01L 21/762* (2006.01)
*H01L 21/764* (2006.01)
(Continued)

(52) U.S. Cl.
CPC ...... *H01L 21/76229* (2013.01); *H01L 21/764* (2013.01); *H01L 29/66659* (2013.01);
(Continued)

(58) Field of Classification Search
CPC .......... H01L 21/76229; H01L 29/7835; H01L 29/66659; H01L 21/764; H01L 29/1045;
(Continued)

(56) References Cited

U.S. PATENT DOCUMENTS 4,356,211 A    10/1982    Riseman
5,789,769 A    8/1998    Yamazaki
(Continued)

FOREIGN PATENT DOCUMENTS

CN    102157431 A    8/2011
JP    2011-151121 A    8/2011
(Continued)

OTHER PUBLICATIONS

Korean Office Action dated Mar. 20, 2019 in counterpart Korean Patent Application No. 10-2013-0034805 (9 pages in Korean).
(Continued)

*Primary Examiner* — Su C Kim
(74) *Attorney, Agent, or Firm* — NSIP Law

(57) ABSTRACT

A semiconductor device and a manufacturing method thereof are provided. The semiconductor device includes: a deep trench in a substrate; a sidewall insulating film on a side surface of the deep trench; an interlayer insulating film on the sidewall insulating film; and an air gap in the interlayer insulating film.

29 Claims, 17 Drawing Sheets

(51) Int. Cl.
  *H01L 29/66* (2006.01)
  *H01L 29/78* (2006.01)
  *H01L 29/423* (2006.01)
  *H01L 29/06* (2006.01)
  *H01L 29/10* (2006.01)

(52) U.S. Cl.
  CPC ...... *H01L 29/7835* (2013.01); *H01L 29/0653* (2013.01); *H01L 29/1045* (2013.01); *H01L 29/42368* (2013.01); *H01L 29/665* (2013.01)

(58) Field of Classification Search
  CPC ............... H01L 29/0653; H01L 29/665; H01L 29/42368
  See application file for complete search history.

(56) References Cited

U.S. PATENT DOCUMENTS

| | | | |
|---|---|---|---|
| 5,966,598 | A | 10/1999 | Yamazaki |
| 7,968,418 | B1 | 6/2011 | Labonte et al. |
| 8,357,989 | B2 | 1/2013 | Onishi et al. |
| 8,569,939 | B2 | 10/2013 | Morii et al. |
| 2002/0102815 | A1 | 8/2002 | Hashimoto et al. |
| 2003/0168698 | A1 | 9/2003 | Shin et al. |
| 2007/0045769 | A1 | 3/2007 | Bian et al. |
| 2007/0063274 | A1 | 3/2007 | Kanda et al. |
| 2008/0318392 | A1 | 12/2008 | Hung et al. |
| 2009/0189246 | A1 | 7/2009 | Wu et al. |
| 2010/0078709 | A1* | 4/2010 | Ogura ................ H01L 27/0248 257/328 |
| 2010/0230741 | A1 | 9/2010 | Choi et al. |
| 2011/0062547 | A1 | 3/2011 | Onishi et al. |
| 2011/0127615 | A1* | 6/2011 | Tanaka ................ H01L 21/8249 257/378 |
| 2011/0175205 | A1* | 7/2011 | Morii ................ H01L 21/76232 257/618 |
| 2012/0049274 | A1 | 3/2012 | Elattari et al. |

FOREIGN PATENT DOCUMENTS

| | | |
|---|---|---|
| KR | 10-2010-0102982 A | 9/2010 |
| KR | 10-2011-0030356 A | 3/2011 |

OTHER PUBLICATIONS

Chinese Office Action dated Aug. 25, 2017 in counterpart Chinese patent application No. 20141019387.2 (8 pages in Chinese).

* cited by examiner

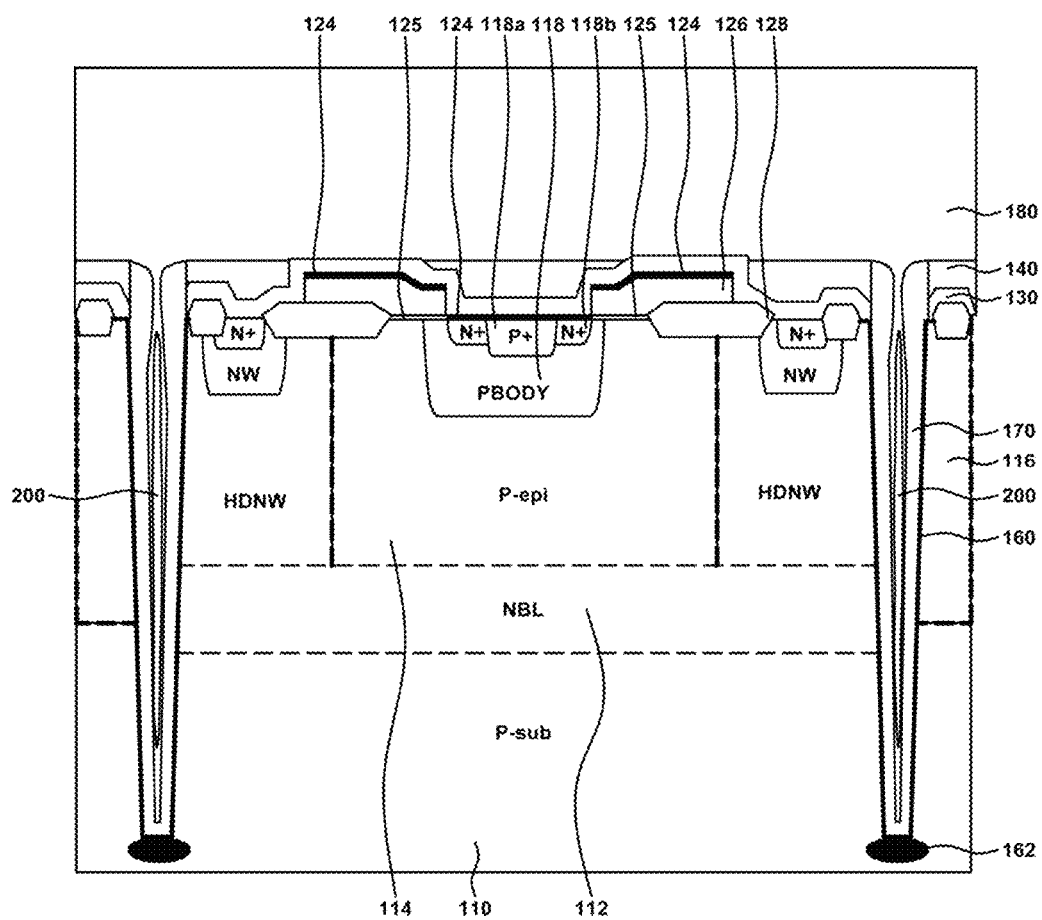

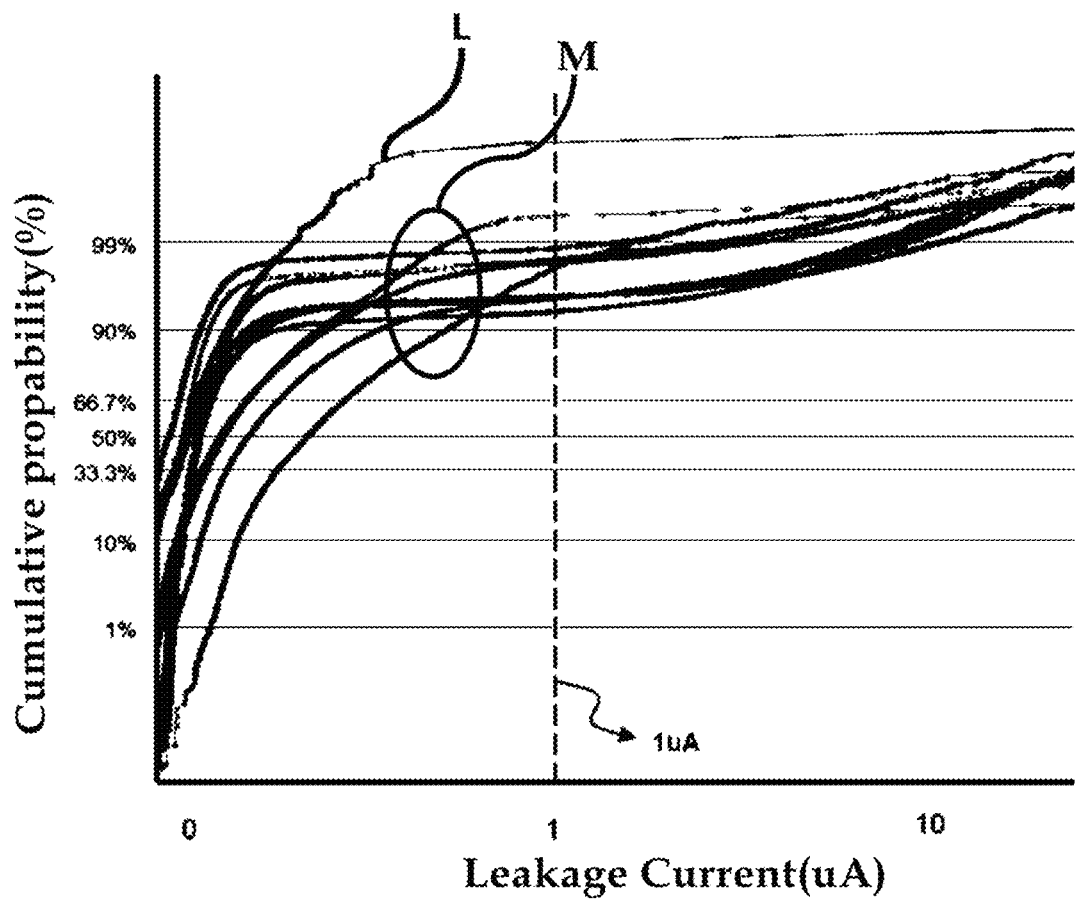

SEMICONDUCTOR DEVICE AND MANUFACTURING METHOD THEREOF

CROSS-REFERENCE TO RELATED APPLICATIONS

This application is a Continuation of U.S. patent application Ser. No. 14/067,335 filed on Oct. 30, 2013, which claims benefit under 35 U.S.C. § 119(a) of Korean Patent Application 10-2013-0034805 filed on Mar. 29, 2013, in the Korean Intellectual Property Office, the entire disclosures of which are incorporated herein by reference for all purpose.

BACKGROUND

1. Field

The following description relates to a semiconductor device and a method of manufacturing the same, and to a semiconductor device manufactured by performing a Deep Trench Isolation (DTI) process on a semiconductor substrate after device structures such as a source, a drain, and a gate are formed on the semiconductor substrate by a silicide process and a method of manufacturing such a semiconductor device.

2. Description of Related Art

The development of electronic technology resulted in an increased demand for compact multi-functional electronic devices. For this reason, System on Chip (SoC) technology emerged. System on chip technology refers to a technology for implementing a single system that integrates a plurality of devices into a single chip. With the recent development of MEMS (Micro-Electro-Mechanical System) technology and NEMS (Nano-Electro-Mechanical System) technology, attempts to implement various devices as a single chip have taken place.

However, when a plurality of devices is integrated into a single substrate, interference is prone to occur between the devices. For instance, heat generated in driving of one device may transfer to another device through the substrate, and the heat may influence an operation of the second device. Thus, the interference between the devices may result in malfunction of the overall product.

In order to prevent the occurrence of malfunctions, a device isolation structure may be utilized to electrically isolate each of the devices on the single substrate from other devices.

Examples of technologies used for forming device isolation structures include a local oxidation of silicon (LOCOS) process, a trench isolation process and the like. The LOCOS process is an isolation method that involves masking a surface of a substrate with a relatively hard material such that a silicon nitride layer, and thermally growing a thick oxide layer in an opening of a mask. The trench isolation process is a method that involves forming a trench having an appropriate depth in a silicon substrate and filling the inside of the trench with an insulating film to electrically isolate devices from each other. Another kind of trench isolation process is the Deep Trench Isolation (DTI) process used for isolating wells.

Among the various technologies for forming device isolation structures, the deep trench isolation process is often applied to satisfy the requirement of high-integration of semiconductor devices. By using a deep trench isolation structure (DTI structure), it is possible to reduce a pitch of the transistor and to improve latch-up leading to a decrease in device characteristics due to current leakage and overcurrent. As a result, the DTI structure has characteristics suitable for reducing the size of chips and for improving the performance of devices.

In manufacturing processes for producing semiconductor devices in which a DTI structure is formed, the DTI process is generally performed before a process of forming a LOCOS or a shallow trench (STI) in the semiconductor substrate.

Incidentally, in manufacturing a semiconductor device such as a Lateral Double-diffused Metal Oxide Semiconductor (LDMOS) used as a high voltage power device, when the DTI process is performed before the LOCOS process or a process of forming a gate electrode, various issues may occur.

For example, in the manufacturing process of the semiconductor device, a plurality of annealing processes are performed as processes subsequent to the DTI process. Accordingly, the thermal stress resulting from the processes may affect a trench structure formed in the semiconductor substrate by the DTI process.

In order to reduce the problems resulting from the thermal stress, many additional processes for releasing the thermal stress may be performed, and the additional processes may in turn impose other challenges or problems.

Patent Document: Korean Laid-Open Publication No. 2011-0030356

SUMMARY

In one general aspect, there is provided a semiconductor device, comprising: a substrate, a second conductivity type buried layer disposed in the substrate, a second conductivity type low dopant density well region disposed on the second conductivity type buried layer, high dopant density well regions of a second conductivity type disposed at left and right sides of the second conductivity type low dopant density well region and disposed on the second conductivity type buried layer, wherein each of the high dopant density well regions has a dopant density higher than that of the second conductivity type low dopant density well region, and the high dopant density well regions are in direct contact with the second conductivity type low dopant density well region and the second conductivity type buried layer, a first conductivity type body region in the second conductivity type low dopant density well region; a second conductivity type source region in direct contact with the first conductivity body region, a first gate electrode and a second gate electrode on the substrate, a deep trench in the substrate, a sidewall insulating film on a side surface of the deep trench, and an interlayer insulating film on the sidewall insulating film, wherein both the first and second gate electrodes overlap with the first conductivity type body region.

The general aspect of the semiconductor device may further include: a well region in the substrate; a body region and a drain region in the well region; and a gate electrode region on the substrate.

The general aspect of the semiconductor device may further include a shallow trench formed between the drain region and the deep trench.

The shallow trench may be a LOCOS trench, and the deep trench may be a DTI structure.

The general aspect of the semiconductor device may further include: an insulating film on the substrate; and a hard mask film on the insulating film, in which the interlayer insulating film is formed on the hard mask film.

A depth of the deep trench may be greater than a depth of the well region.

The sidewall insulating film may include a first sidewall insulating film and a second sidewall insulating film.

A height of the sidewall insulating film may be greater than a height of the gate electrode region, and may be equal to a height of the hard mask film.

The interlayer insulating film may extend to a bottom of the deep trench.

The sidewall insulating film may include a HLD film, a TEOS film, a SOG film or a BPSG film, and the interlayer insulating film may include a BPSG film.

An upper end of the air gap may be located lower than an upper surface of the substrate.

An upper end of the air gap may be located less than or equal to 0.5 μm below an upper surface of the substrate.

A total thickness of the sidewall insulating film formed within the deep trench may be in a range of 1% to 70% of a width of an upper end of the deep trench.

A total thickness of the sidewall insulating film and the interlayer insulating film formed within the deep trench may be in a range of 1% to 80% of a width of an upper end of the deep trench.

The general aspect of the semiconductor device may further include: a support formed between the air gap and another air gap adjacent to the air gap.

In another general aspect, there is provided a semiconductor device comprising: a substrate, a second conductivity type buried layer disposed in the substrate, a second conductivity type low dopant density well region disposed on the second conductivity type buried layer, high dopant density well regions of a second conductivity type disposed at left and right sides of the second conductivity type low dopant density well region and disposed on the second conductivity type buried layer, wherein the second conductivity type low dopant density well region has a dopant density lower than that of the high dopant density well regions which are in direct contact with the low dopant density well region and the second conductivity type buried layer, a gate electrode disposed on the second conductivity type low dopant density well region, field oxide regions on the second conductivity type low dopant density well region and high dopant density well regions, a deep trench disposed adjacent to at least one of the field oxide regions and between two of the field oxide regions, a sidewall insulating film disposed on a side surface of the deep trench, an interlayer insulating film formed in the deep trench region and on the gate electrode, and an air gap within the deep trench, wherein the air gap has a sharp pointed cross-sectional shape toward a bottom of the deep trench.

The air gap may be located within the trench, and an upper end of the air gap may be formed at a position lower than an upper surface of the substrate.

Throughout the drawings and the detailed description, unless otherwise described, the same drawing reference numerals will be understood to refer to the same elements, features, and structures. The relative size and depiction of these elements may be exaggerated for clarity, illustration, and convenience.

BRIEF DESCRIPTION OF THE DRAWINGS

FIGS. 1 to 12B are cross-sectional views for describing an example of a method for fabricating a semiconductor device according to the present disclosure.

FIG. 17 is a cumulative curve illustrating current leakage characteristics of an example of a semiconductor device according to the present disclosure.

Figure 1:
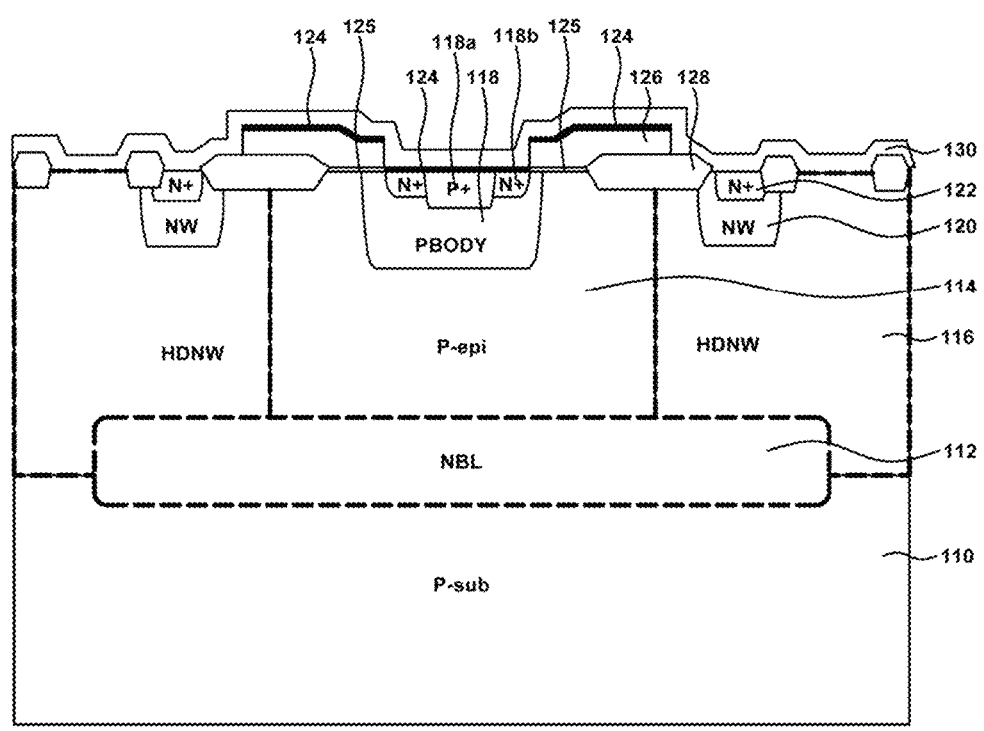

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

According to the present disclosure, there is provided an example of a manufacturing process in which a DTI process is performed on a semiconductor device. The DTI process for isolating devices may be performed immediately after a gate electrode or a silicide structure is formed during the manufacturing process of the semiconductor device.

Hereinafter, a semiconductor device and a manufacturing method of producing the semiconductor device according to an example of the present disclosure will be described with reference to FIGS. 1 to 12. FIGS. 1 to 12 are cross-sectional views for describing an example of a manufacturing method of a semiconductor device according to the present disclosure. In the example of the manufacturing method, the process of forming an N-type LDMOS (Lateral Double diffused MOS) device will be described as an example of a lateral DMOS; however, the present disclosure is not limited thereto.

FIG. 1 is a cross-sectional view of a semiconductor device before the DTI process is performed in accordance with an example of a manufacturing method according to the present disclosure. The illustrated cross-sectional view is a cross-sectional view of an NLDMOS device as an integrated power device constituting a BCD (Bipolar-CMOS-DMOS) device.

Referring to FIG. 1, the NLDMOS device is in a state in which device structures such as a source, a drain, and a gate are already formed.

A structure of the NLDMOS device will be briefly described below.

In the NLDMOS device, an n-type buried layer (NBL) 112 is formed inside a p-type silicon substrate 110 as a high doped region. A p-epitaxial layer 114 is formed on the buried layer 112, and high density n-well (HDNW) regions 116 are formed at left and right sides of the p-epitaxial layer 114. As explained later, the p-epitaxial layer 114 may be changed to an n-type region after the process of forming a DTI structure. The p-epitaxial layer 114 is a region in which impurities doped into the high density n-well (HDNW) regions 116 are diffused through an annealing process during the manufacture process of the semiconductor device. After the conversion into an n-type region, this region is an n-well region (i.e., a low density n-well region) doped at a density relatively lower than those of the high density n-well (HDNW) regions 116. The low density n-well region is formed to have a depth shallower than that of a trench to be described below.

Gate electrodes 126 are formed above the silicon substrate 110 with a gate oxidation film 125 disposed therebetween for insulation.

A p-body region 118 in which a $p^+$ contact region 118$a$ and $n^+$ source regions 118$b$ are provided is formed in a predetermined region of the p-epitaxial layer 114 or the low density n-well region. High density $n^+$ drain regions 122 surrounded by low concentration doped regions (NW) 120 are formed in the high density n-well (HDNW) regions 116. In this example, the p-body region 118 may be initially formed on the p-epitaxial layer 114 or the low density n-well region. The p-body region 118 may be subsequently formed in the p-epitaxial layer 114 before the semiconductor device is manufactured and/or formed in the low density n-well region after the annealing processes are all finished. Thus, the $p^+$ contact region 118$a$ and $n^+$ source regions 118$b$ are subsequently disposed within the p-body region.

Referring to FIG. 1, a silicide layer 124 is formed on the p-body region 118 and on the gate electrodes 126. The silicide layer 124 includes, for example, $TiSi_2$ or $CoSi_2$.

A LOCOS trench or a shallow trench (STI) region 128 is formed in order to reduce an electric field between the gate electrode 126 and the $n^+$ drain region 122.

In an example of a method for manufacturing a semiconductor device, the process of forming the trench starts after the silicide layer 124 is formed.

Referring to FIG. 1, an insulating film 130 is deposited on the entire surface of the p-type silicon substrate 110, including the top surfaces of the p-body region 118, the $n^+$ drain regions 122, and the gate electrodes 126. The insulating film 13 may be deposited by a low-pressure chemical vapor deposition (LPCVD) method or a high temperature low pressure deposition (HLD) method. In this example, the insulating film 130 is deposited to have a thickness of about 1,000 angstroms to about 2,000 angstroms. Examples of the insulation film 130 may include an oxidation film or a nitride film. The nitride film may more effectively serve as an etching stopper film so as not to expose the gate electrode 126.

Figure 2:
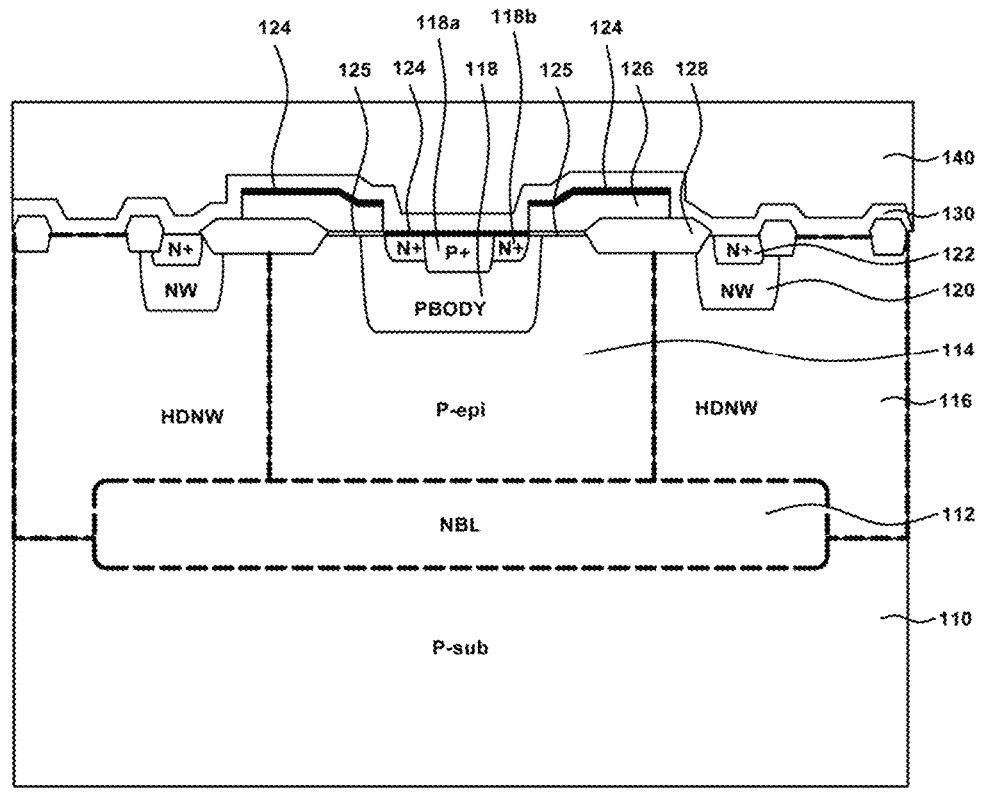

Subsequently, referring to FIG. 2, a Tetra Ethyl Ortho Silicate (TEOS) layer 140 is deposited on the insulation film 130 as a silicon oxidation film. The TEOS layer 140 may have a thickness of about 5,000 angstroms to about 15,000 angstroms. The TEOS layer 140 may serve as a hard mask used as a blocking layer in a subsequent trench forming process.

Figure 3:
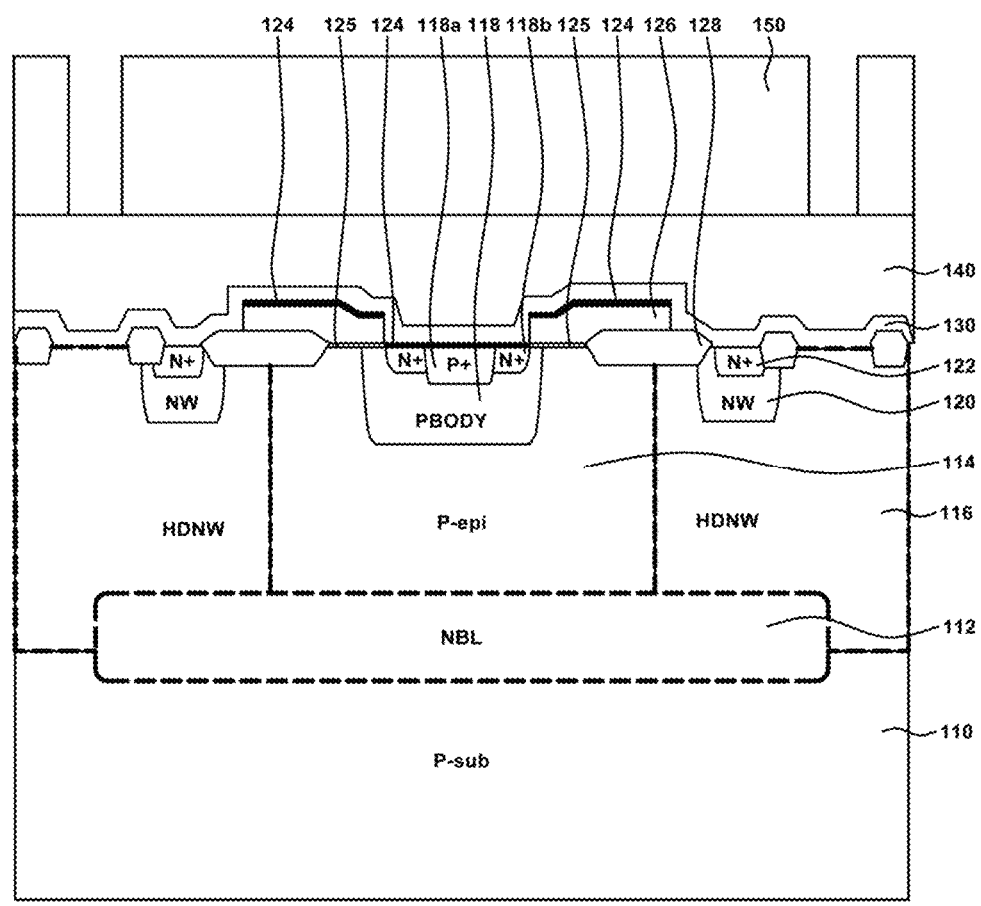

Referring to FIG. 3, after the TEOS layer 140 is formed as the hard mask, a patterned photo resist 150 is coated on the TEOS layer 140. The photo resist 150 is used to remove the TEOS layer 140 as oxides for the hard mask by a photo-lithography method. Further, the photo resist is patterned such that regions corresponding to regions of the p-type silicon substrate 110 where trenches are formed are not coated. Otherwise, a separate process for patterning the photo resist 150 may be performed.

Figure 4:
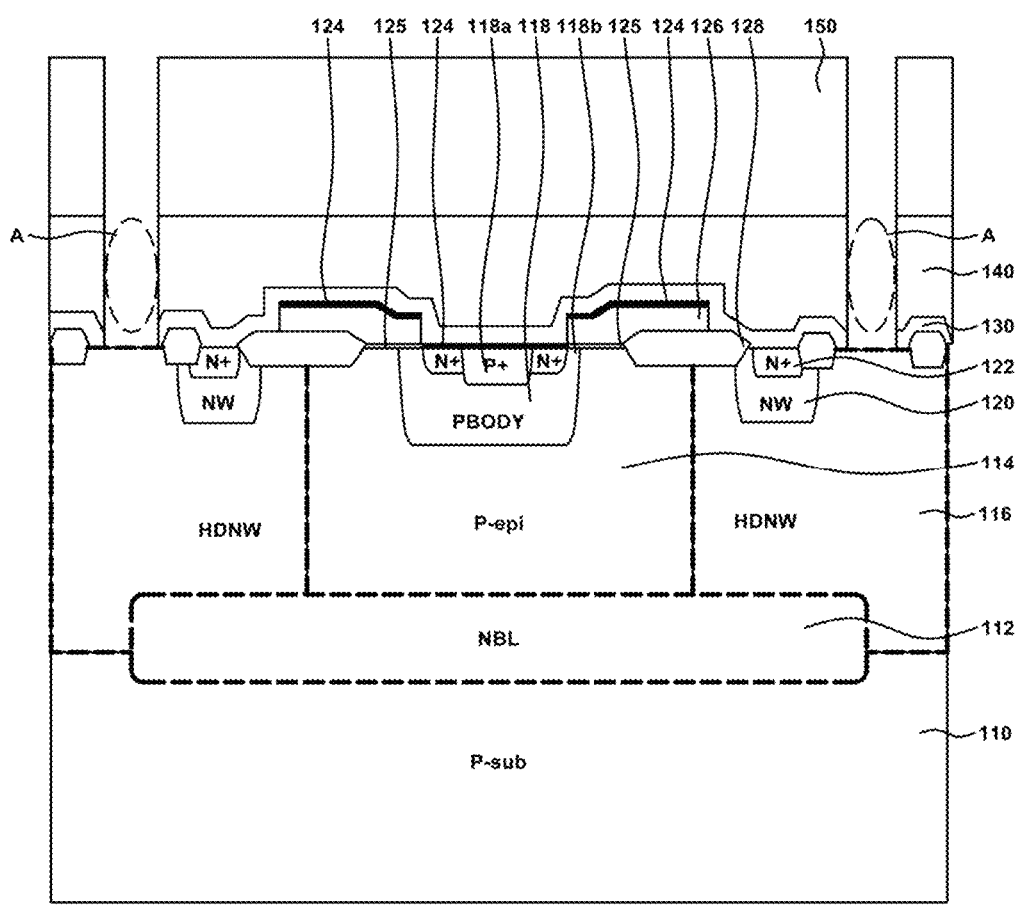

Thereafter, referring to FIG. 4, the TEOS layer 140 is etched by using the photo resist 150 as a mask. Then, parts of the TEOS layer 140 corresponding to the uncoated regions of the photo resist 150 are etched to a surface of the p-type silicon substrate 110. As a result, portions of top surfaces of the high density n-well (HDNW) regions 116 are partially exposed. For instance, referring to FIG. 4, the TEOS layer 140 is etched to correspond to the pattern of the photo resist 150. In FIG. 4, the portions of the TEOS layer 140 that are etched is marked with reference label "A."

Figure 5:
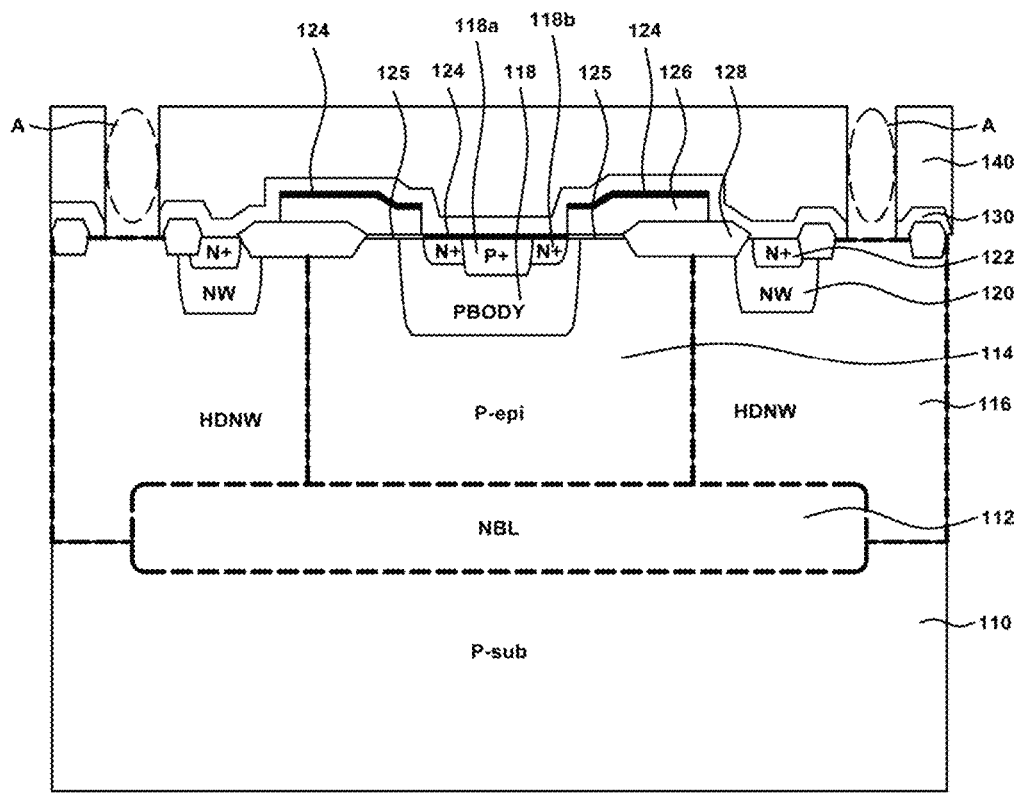

When a part of the TEOS layer 140 is etched, the photo resist 150, which has been used as the mask, may be removed. The photo resist 150 may be removed by a dry ashing process and a cleaning process. FIG. 5 illustrates a state in which a part of the TEOS layer 140 is etched and the photo resist 150 is removed.

Subsequently, a process of forming a trench in the p-type silicon substrate 110 is performed.

Figure 6:
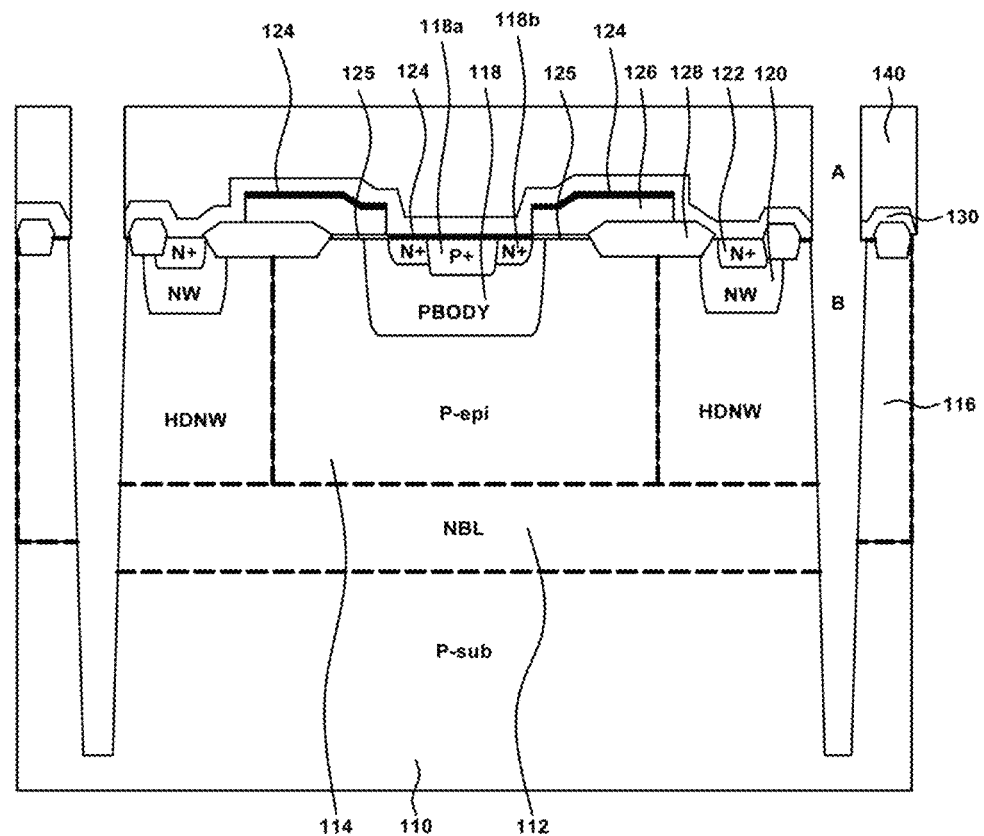

Referring to FIG. 6, the p-type silicon substrate 110 is etched, and trench regions B are formed. Here, the trench regions B are formed in the p-type silicon substrate 110 by a dry etching method, and are formed to correspond to the etched regions A of the TEOS layer 140. An etching gas used in the dry etching method does not influence the TEOS layer 140 but etches only the p-type silicon substrate 110. In this example, a side surface of the trench region B is not at a right angle with the upper surface of the semiconductor substrate; rather, the side surface of the trench region B is a slightly inclined surface. The inclined surface results due to the weakening of the intensity of the etching gas along the depth of the trench. In one example, the trench formed by such an etching method has a depth of about 2 μm to about 30 μm. In another example, the trench region B formed in the p-type silicon substrate 110 has a depth of about one and a half to about three times a depth of the p-epitaxial layer 114 formed in the p-type silicon substrate 110.

Referring to FIG. 6, when the etching process for forming the trench region B is performed, polymers are also formed. Since such polymers cause a decrease in performance of the semiconductor device, the polymers need to be removed. Accordingly, after the etching process is finished, it is necessary to perform a post cleaning process for removing the polymers. A cleaning solution that contains a Buffered Oxide Etchant (BOE) is used as a cleaning solution during the post cleaning process. Also, after the post cleaning process is completed, an oxidation process may be performed. The oxidation process may be performed to remove various defects generated on a surface of the p-type silicon substrate 110 during the etching process performed to form the trench region B.

Figure 7:
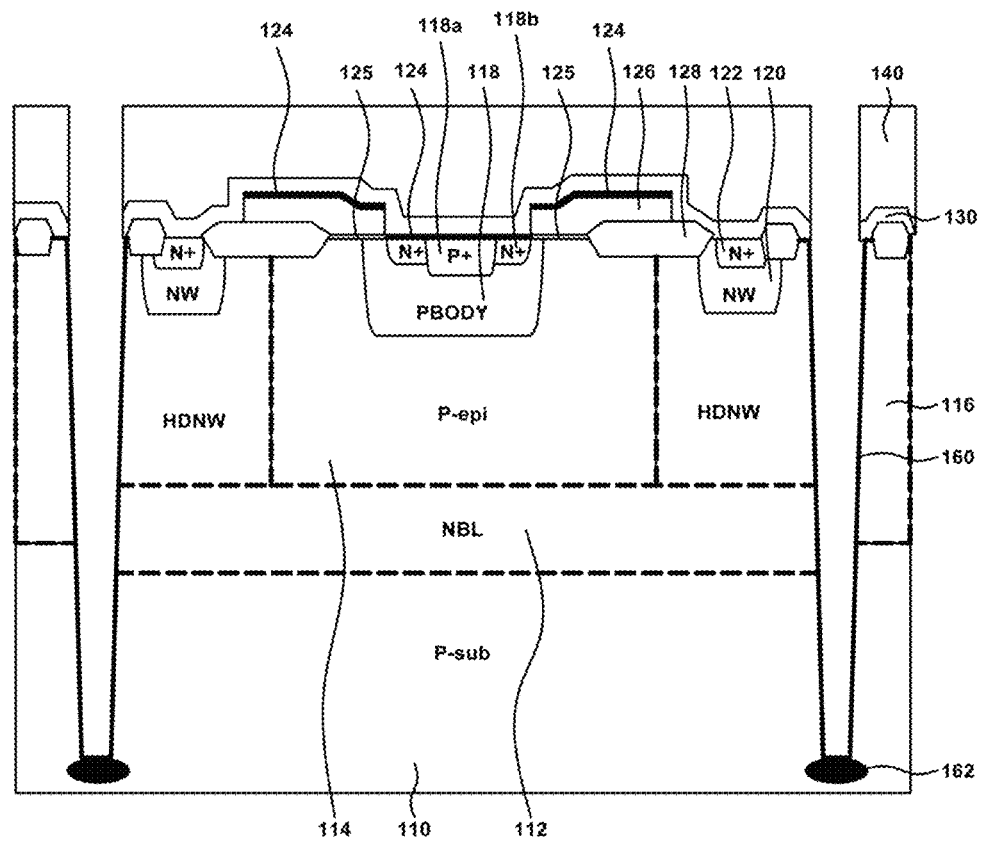

As described above, when the trench region B is formed in the p-type silicon substrate 110, a dry oxidation process is performed to form a thermal oxide film 160 on a boundary of the trench region B as illustrated in FIG. 7. This thermal oxide film is formed in order to block electric leaking components occurring along the boundary of the trench region B. In addition, channel stop implantation is performed on a bottom surface 162 of the trench region B to block leakage current to prevent the formation of channels other than predetermined channels.

Figure 12B:
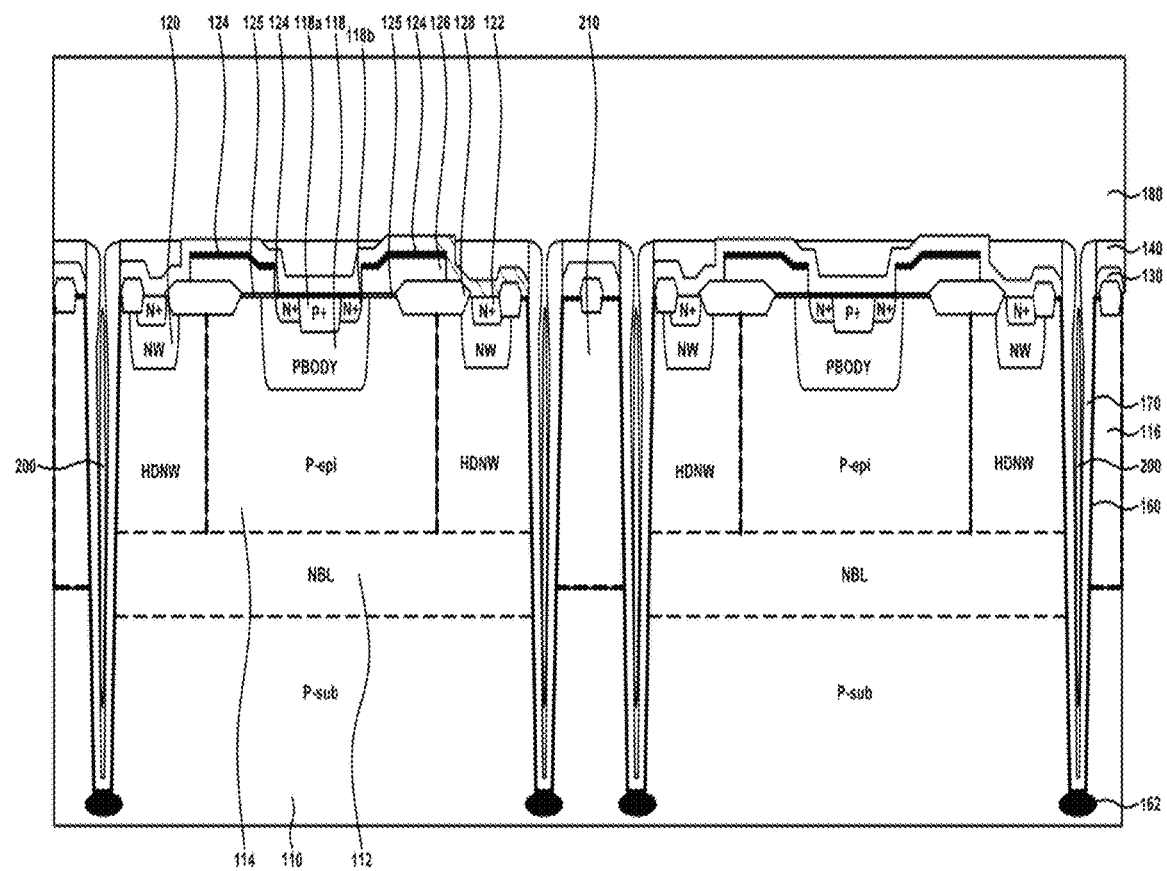

Referring to FIGS. 12A and 12B, a gap-fill process is subsequently performed to form a void or an air gap 200 within the trench region B. The air gap serves as an insulating member. Accordingly, when the air gap is formed, it is possible to insulate devices formed in the p-type silicon substrate 110 in a horizontal direction in addition to a trench structure to be electrically stabilized.

A height of the air gap formed within the trench region B contributes significantly to the ability of the trench to prevent interferences. According to one example, an upper end of the air gap is located at a position lower than the surface of the p-type silicon substrate 110. If the height of the air gap is higher than the surface of the silicon substrate 110, the inside of the air gap may be exposed to the outside in a deposition process of a HLD oxidation film as oxides and an etch-back process of removing a part of the deposited HLD oxidation film, which will be described below. Thus, the inside of the air gap may be contaminated by foreign substances, so that a decrease in performance of the semiconductor device may result.

Hereinafter, a process for forming the air gap will be described in detail.

In this example, the deposition process and the etch-back process of the HLD oxidation film, which form a sidewall insulating film, are repeatedly performed twice. However, the present disclosure is not limited thereto. In other examples, the deposition process and the etch-back process of the HLD oxidation film may be performed one time as long as the air gap is formed at a position lower than the top surface of the silicon substrate. Alternatively, the deposition process and the etch-back process may be performed again, for the third time, if the air gap is not appropriately formed even though the deposition process and the etch-back process are performed twice. However, in this example, the deposition process and the etch-back process may be performed twice in order to simplify the manufacturing process. Accordingly, the deposited HLD oxidation film needs to have an appropriate thickness in consideration of the subsequent process.

Figure 8:
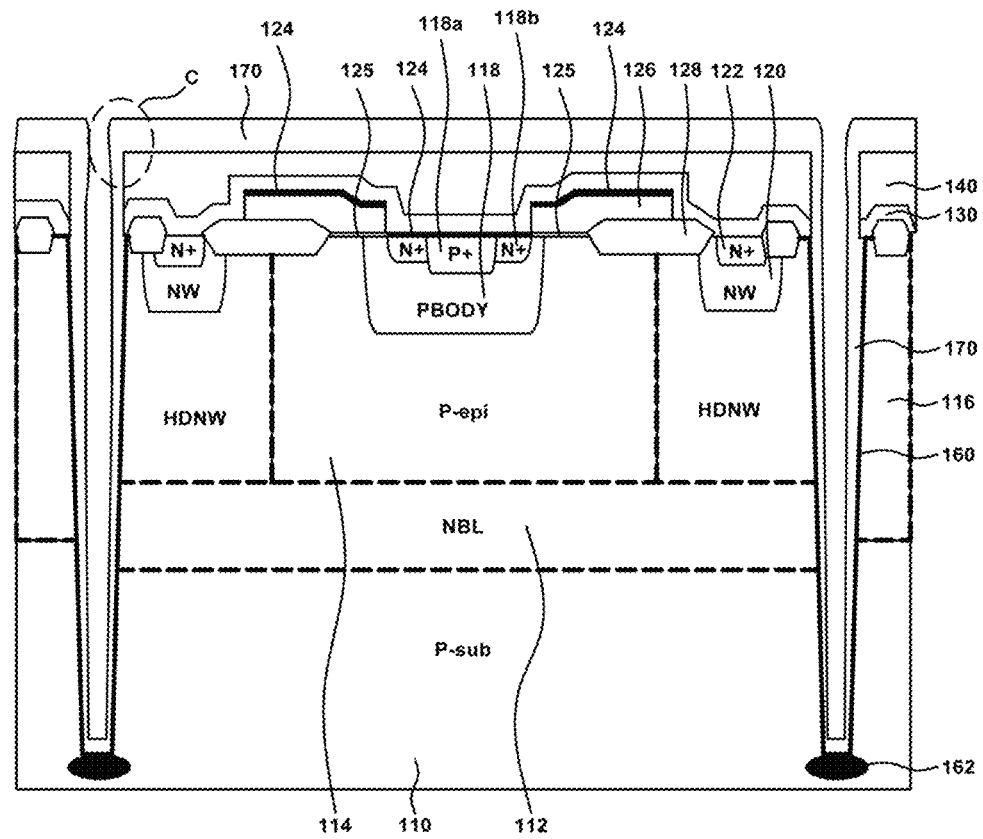

Referring to FIG. 8, the deposition process of the HLD oxidation film is performed to form a first sidewall insulating film of the air gap. Hereinafter, this process is referred to as a "first DTI HLD deposition process."

During the first DTI HLD deposition process, a HLD oxidation film 170 is deposited on a top surface of the p-type silicon substrate 110 and on the side surface of the trench region B. The HLD oxidation film 170 includes an oxidation film material. During the first DTI HLD depositing process, the HLD oxidation film 170 needs to be deposited to have an appropriate thickness such that after the subsequent two etch-back processes and one deposition process, the air gap is formed at a position lower than the surface of the p-type silicon substrate 110. The thickness to be used may be determined based on an experiment result value obtained through multiple experiments. Further, referring to FIG. 8, the HLD oxidation film 170 is formed with a greater height than the gate electrode 126, and is formed to be approximately equal or similar to the TEOS layer 140 in height. The TEOS layer may serve as a hard mask.

In one example, a deposition temperature of the HLD oxidation film 170 used as a gap-fill material for the trench region B may range between about 550° C. to about 750° C. In the event it is necessary to avoid high deposition temperature during the manufacturing process, a material such as TEOS, SOG, or BPSG that have a low deposition temperature may be deposited instead of the HLD oxidation film 170. The deposition temperature of the TEOS is approximately 400° C. lower than the HLD oxidation film 170.

The HLD oxidation film 170 is deposited by a HLD method. The HLD method results in the formation of a LPCVD oxidation film, and the thickness of the HLD oxidation film 170 deposited on the top surface of the p-type silicon substrate 110 is slightly different from the thickness of the HLD oxidation film 170 deposited on the side surface of the trench region B.

Accordingly, referring to FIG. 8, an edge C of an upper edge of the side surface of the trench region B and the top surface of the p-type silicon substrate 110 are formed in a thick overhang shape by the different thicknesses of the HLD oxidation films 170 along the depth of the trench region B. That is, the width of the void within the trench region B may be broader at the middle portion of the trench region B than at the upper portion of the trench region B.

Figure 9:
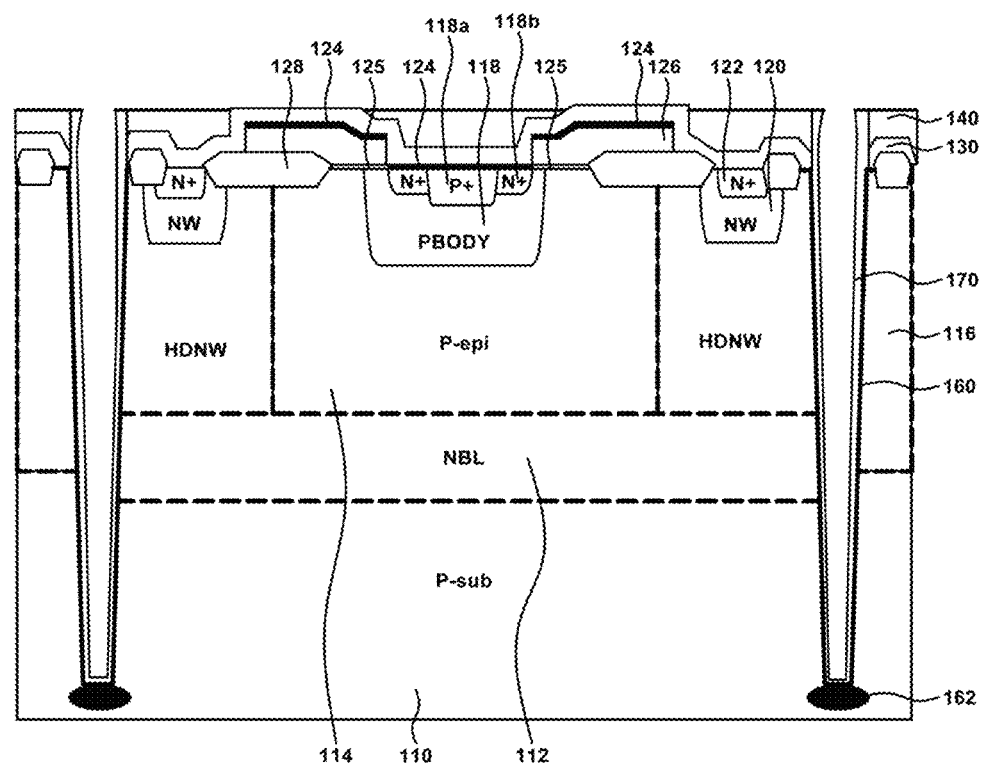

After the first DTI HLD deposition process is finished, a first etch-back process of removing a part of the HLD oxidation film 170 is performed. The first etch-back process is performed by the dry etching method. Referring to FIG. 9, during the first etch-back process, the HLD oxidation film 170 formed on the p-type silicon substrate 110 and a portion of the TEOS layer 140 are removed. In other words, as illustrated in FIG. 9, the TEOS layer 140 is removed until a part of the oxidation film or the nitride film 130 formed on the gate electrode 126 is exposed. In this example, the etch-back process is performed with care so as not to damage a structure of the gate electrode 126.

Referring back to FIG. 9, a certain amount of HLD oxidation film 170 formed on the side surface of the trench region B remains after the first etch-back process.

After the completion of the first DTI HLD deposition process and the first etch-back process, as illustrated in FIG. 9, a distance between the upper edges of the trench region B is enlarged. Thus, it is difficult to form an air gap of appropriate thickness within the p-type silicon substrate 110.

Figure 10:
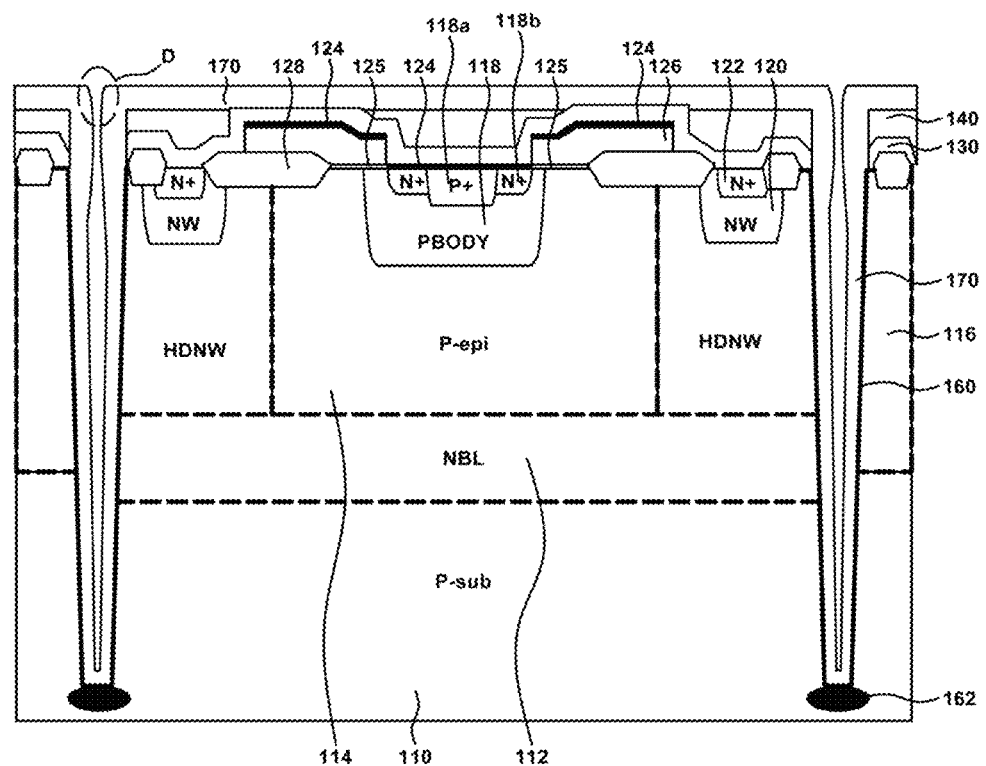

For this reason, as illustrated in FIG. 10, a second DTI HLD deposition process is performed. The second DTI deposition process is performed in a similar manner to the first DTI HLD deposition process. FIG. 10 illustrates a state of the semiconductor device after the second DTI HLD deposition process is performed. Referring to FIG. 10, a distance between the two upper edges of the trench region B decreases due to the second DTI deposition process, and the upper edges D of the trench region B again have an overhang shape. In this example, the distance between the side walls of the trench region B is greater in a middle region of the trench region B than the distance between the two upper edges D of the trench region B.

Figure 11:
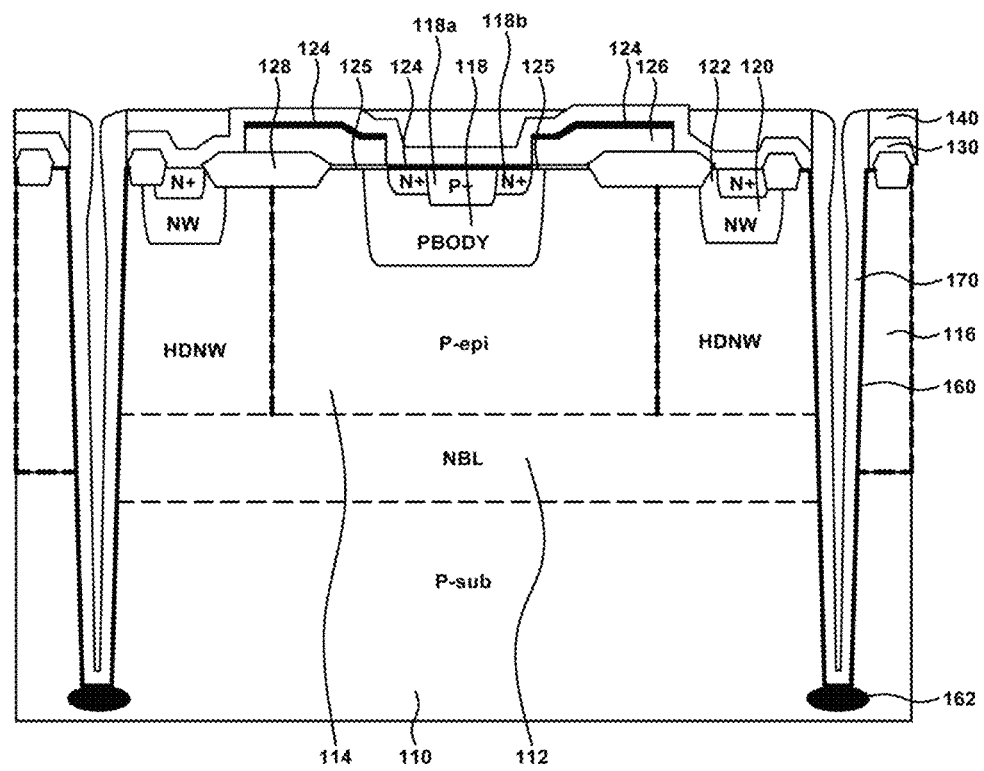

Referring to FIG. 11, subsequently, a second etch-back process is performed to remove the HLD oxidation film 170. The second etch-back process needs to be performed so as not to damage structures of the device such as the gate electrode 126. The structure that results after the second etch-back process is illustrated in FIG. 11. As illustrated in FIG. 11, the overhang shape of the trench B is preserved. In addition, a distance between the upper edges of the trench region B is smaller after the second etch-back process than the distance between the upper edges after the first etch-back process.

As demonstrated by this example, in order to form the air gap in the trench region B at a position lower than the surface of the p-type silicon substrate 110, the deposition process and the etch-back process of the HLD oxidation film may be performed twice. In this example, performing the deposition process and the etch-back process twice as illustrated facilitate forming the overhang structure along the edges of the upper portions of the trench region B. For instance, in this example, the overhang structure found in the final product is formed during the second deposition process of the HLD oxidation film. Although the HLD oxidation film 170 is largely etched during the etch-back process to decrease the height of the air gap, the etch-back process is performed so as not to influence structures of the device such as the gate electrode 126 as described above.

Lastly, after the deposition process and the etch-back process of the HLD oxidation film are performed twice, a BPSG (boron phosphorus silicate glass) material 180 used as an interlayer insulating material (ILD) may be deposited on the entire area of the p-type silicon substrate 110 and may seal the opening along the upper edges of the trench region B in an upper portion of the trench region B, forming an air gap within a middle region of the trench region B. Referring to FIGS. 12A and 12B, in one example, the BPSG 180 is deposited within the trench and fills a portion of the trench. A film of the BPSG 180 used during the process needs to have flow properties that are more favorable than the HLD oxidation film during the high-temperature annealing process. With suitable flow properties, the BPSG may pass through a narrow entrance between the upper edges of the trench region B. As a result, the BPSG may be deposited on the HLD oxidation film formed on the side surfaces of the trench. In addition, some of the BPSG may be deposited on the lower portion of the trench.

Referring to FIG. 12A, after the gap-fill process is performed, the BPSG 180 is deposited over the entire surface of the p-type silicon substrate 110 as an interlayer insulating film. The BPSG 180 also seals the opening to the trench region B, so that the air gap 200 is formed within the trench region B.

FIG. 12B illustrates two semiconductor devices that are arranged in repetition in a horizontal direction. Further, a support is formed between the two semiconductor devices. The support will be further described below with reference to FIG. 16.

Figure 13:
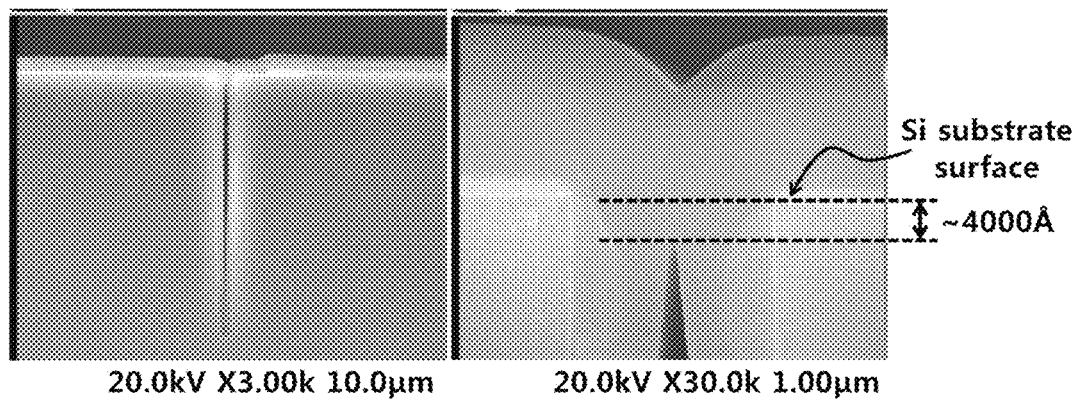
FIG. 13 is a photograph depicting an air gap formed after the process is finished in an example of a semiconductor device formed according to the present disclosure.
Figure 14:
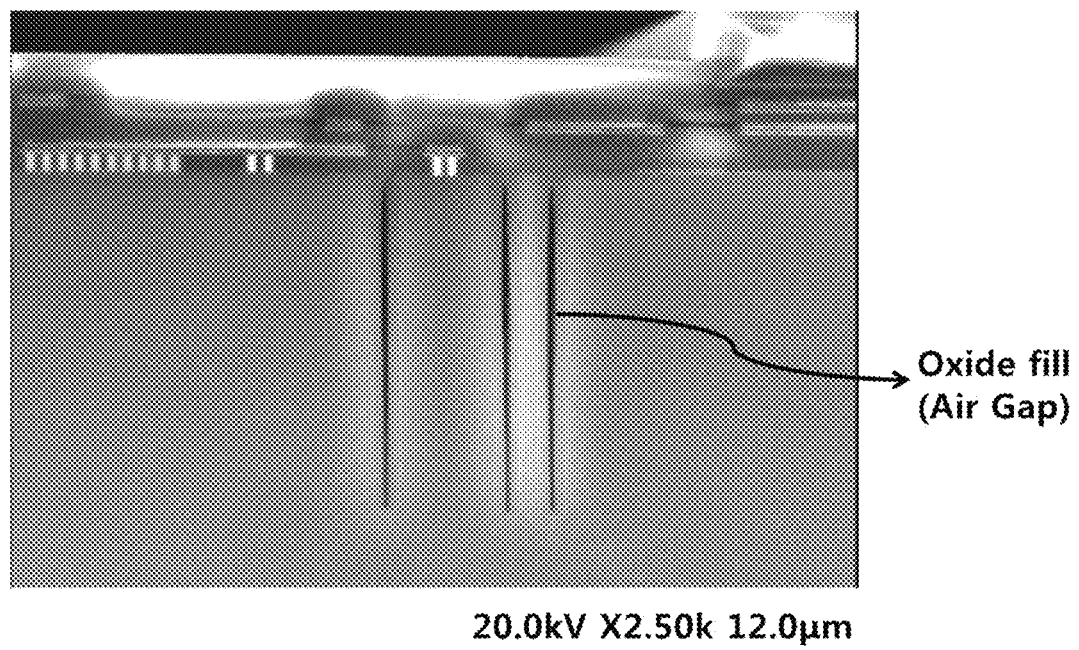
FIG. 14 is a photograph depicting an example of a semiconductor substrate in which two semiconductor devices are provided with air gaps 200 in a horizontal direction.

Meanwhile, referring to FIGS. 13 and 14, an air gap formed in a silicon substrate through the example of manufacturing process described above is illustrated in photographs.

FIG. 13 depicts an air gap formed after the trench producing process described above. FIG. 13(a) demonstrate the overhang shape of the trench formed by the above described process. As depicted in FIG. 13(b), the air gap is formed at a position lower than a surface of the silicon substrate. According to one example, an upper edge of the air gap may be formed at a position that is less than or equal to 0.5 µm upwards from a surface of the semiconductor substrate.

FIG. 14 depicts a semiconductor substrate in which two semiconductor devices are formed in a horizontal direction. A plurality of air gaps 200 is disposed between the semiconductor devices. With such a configuration, it is possible to effectively prevent interference between the semiconductor devices by the air gaps.

Figure 15:
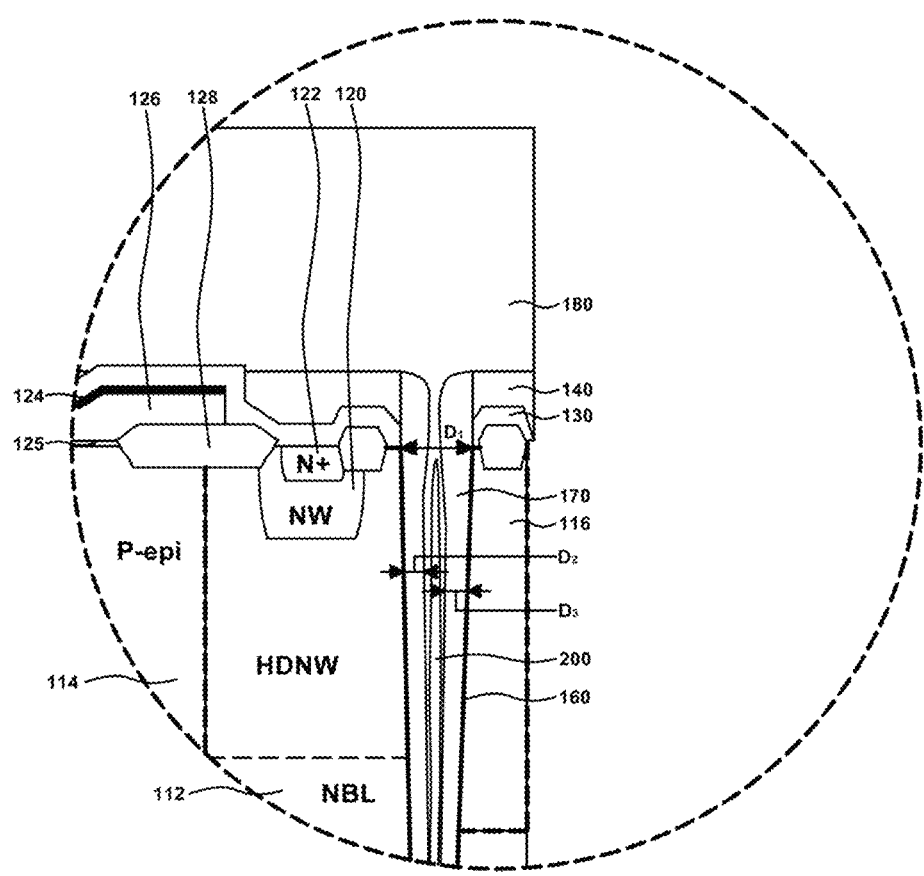
FIG. 15 is an enlarged view of an example of a trench region illustrated in FIGS. 12A and 12B.

FIG. 15 illustrates an enlarged cross-sectional view of the trench region of the semiconductor device illustrated in FIGS. 12A and 12B. FIG. 15 further describes various dimensions of the trench region B.

Referring to FIG. 15, in one example, a critical diameter D1 or a width of the upper end portion of the trench region B is in a range of 1.2 µm to 3.0 µm, and a thickness (D2+D3) of the HLD oxidation film 170 formed on the side surface of the air gap 200 in a middle portion of the trench region B is in a range of 0.30 µm to 0.8 µm.

In one example, the HLD oxidation film 170 is formed to have a total thickness (D2+D3) in a range of about 1% to about 70% of the width or the critical diameter D1. By setting the thickness in this range, it is possible to minimize stress and to easily form the air gap 200 in the trench region B. When the thickness of the HLD oxidation film 170 is thinner than 1% of the width of the upper end of the trench, it is difficult to easily form the air gap 200. Further, when the thickness of the HLD oxidation 170 is thicker than 70% of the width of the upper end of the trench, stress may occur on the silicon substrate due to a difference in coefficients of thermal expansion between the HLD oxidation film 170 and the n-well region 116 of the silicon substrate.

In addition, the HLD oxidation film 170 and the BPSG 180 may be formed to have the total thickness in a range of about 1% to about 80% of the width of the upper end of the trench. With the provided dimension, it is possible to facilitate the formation of the air gap and reduce the occurrence of stress.

Figure 16:
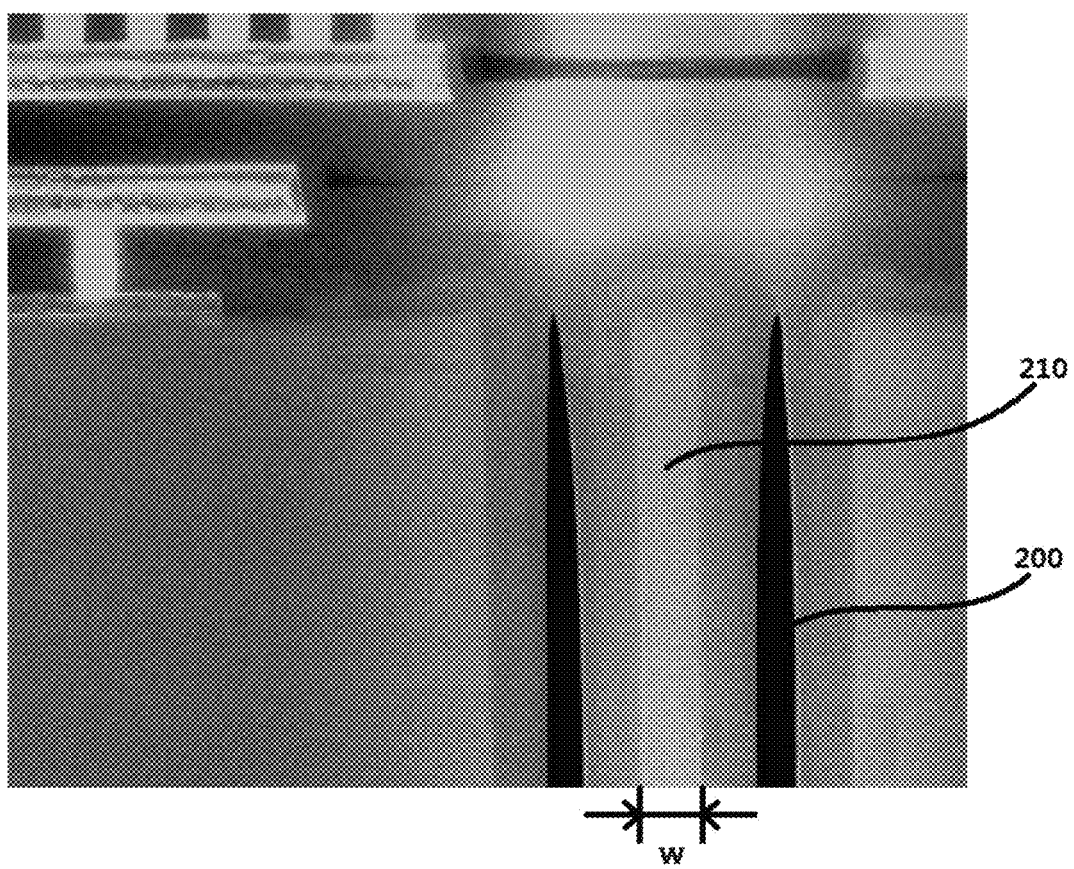
FIG. 16 is an enlarged view of a semiconductor substrate in which two semiconductor devices are brought into contact with each other, as illustrated in FIG. 12B.

FIG. 16 is an enlarged view of a portion of the semiconductor substrate of FIG. 12B in which the two semiconductor devices are provided in contact with each other. Referring to FIG. 16, a support 210 is formed between the air gaps 200 provided around the peripheries of two adjacent semiconductor devices. The support 210 serves to maintain a shape of the air gap 200. In the example depicted in FIG. 16, the support 210 has a width w of approximately 0.5 µm to approximately 3 µm.

In a semiconductor device manufactured by the process described above, current leakage characteristics are considerably improved in comparison to the conventional semiconductor devices. The above conventional semiconductor devices herein refers to a semiconductor device manufactured by being formed of DTI structure before forming device structures e.g. a source and drain, etc. FIG. 17 is a cumulative curve illustrating current leakage characteristics according to the example described above. The X-axis represents measuring leakage current of each device and Y-axis represents cumulative percent at each level of the leakage current level. For comparison, vertical dot line is inserted at leakage current level at 1 uA. The curve "L" corresponds to the example according to the present disclosure. The curve "L" shows the higher cumulative percent at 1 uA than other curves "M", which means that the leakage current level more decreased by fabricating DTI structure after forming device structures e.g. a source and drain. It can be seen from FIG. 17 that the current leakage characteristics are significantly improved in comparison to the conventional semiconductor devices. Here, the current leakage characteristics in FIG. 17 result from one semiconductor device as illustrated in FIG. 12A and the curves other than curve L represent values of the current leakage characteristics to the above conventional semiconductor devices.

As stated above, in the examples of semiconductor device according to the present disclosure, by performing the DTI process after a transistor structure such as a source or a drain is formed in the semiconductor substrate, it is possible to reduce a manufacturing time and cost of the semiconductor device.

An aspect of the present disclosure provides a semiconductor device and a manufacturing method thereof, with which it is possible to simplify a manufacturing process and to solve issues occurring in an annealing process subsequent to a DTI process by improving the manufacturing process of the semiconductor device that performs an insulating operation between devices by using a DTI structure.

In this example, the semiconductor device may be manufactured as a final product through multiple steps of a manufacturing process, and the present disclosure provides, as an example, a semiconductor device with performance and effect equivalent to or even superior to existing semiconductor devices by improving the manufacturing process of the semiconductor device.

There are also provided a semiconductor device and a manufacturing method thereof, with which a manufacturing process of the semiconductor device may be improved such that a deep trench isolation (DTI) process for isolating a device is performed immediately after a gate electrode or a silicide structure is formed in the manufacturing process of the semiconductor device. Since the process of forming a DTI structure is performed after the silicide process, it is possible to prevent various defects caused by an annealing process performed after the DTI process and to reduce the number of steps in the manufacturing process of the semiconductor device in which the DTI structure is formed. As a result, with this example, it is possible to reduce a manufacturing time and cost.

Although the present disclosure has been described in connection with a number of examples, it should be understood by those skilled in the art that various changes, modifications, and equivalent examples can be made without departing from the scope and sprit of the present disclosure. Accordingly, the scope of the present disclosure should not be limited by these examples.

For instance, although various examples of the present disclosure have been described with respect to an NLDMOS (Lateral Double diffused MOS) device, the present disclosure is applicable to other types of semiconductor devices, including semiconductor devices having a p-type LDMOS device and a Deep trench Isolation structure (DTI structure).

Further, while various examples of manufacturing methods have been described in which the deposition process and the etch-back process of the HLD oxidation film are performed twice, the present disclosure is not limited thereto. For example, the deposition process and the etch-back process of the HLD oxidation film may be performed only one time.

Moreover, after a DTI structure is formed, when the DTI etching process is finished, the forming process of the LPCVD oxidation film, the deposition process of the BPSG (boron phosphorus silicate glass), the etch-back process, and the deposition process of the BPSG (boron phosphorus silicate glass) may be performed instead of the gap-fill process of the trench region, so that the air-gap of the trench region may be filled.

Examples of semiconductor devices and manufacturing methods thereof may exhibit the following effects.

During the manufacturing process of the semiconductor device in which a DTI structure is formed, a process of forming the DTI structure that is generally performed before the existing LOCOS process, may be performed after a silicide process in which transistor structures such as a source and a drain are all formed.

Accordingly, it is possible to prevent occurrence of various defects in a substrate or a trench structure that results during an annealing process. In one example, the defects of the trench structure are prevented, so that current leakage characteristics of the semiconductor device may be improved.

Conventionally, in order to manufacture the semiconductor device to which the DTI structure is formed, an additional process is required for controlling the defects of the semiconductor substrate. However, with the method described in the present disclosure, by changing an order of the DTI process, it is possible to reduce the number of steps in the manufacturing process of the semiconductor device in which the DTI structure is formed. As a result, it is possible to reduce a manufacturing time and cost. For example, seventy one (71) steps are substantially required for the existing process for manufacturing the semiconductor device through the DTI step. However, in the present disclosure, it is possible to reduce the number of steps to be thirty (30) steps.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a substrate;
   a deep well region in the substrate;
   a body region in the deep well region;
   a source region in the body region;
   a gate electrode formed on the substrate and overlapping with the body region;
   a deep trench in the substrate;

a support formed between air claps respectively formed within the deep trench provided around two adjacent semiconductor devices, the support being configured to maintain a shape of respective air gaps; and
a channel stop implantation region at a bottom of the deep trench,
wherein the deep trench is tapered in shape so that an upper end of the deep trench has a greater width than a lower end of the deep trench.

2. The semiconductor device according to claim 1, further comprising:
a sidewall insulating film on a side surface of the deep trench;
an interlayer insulating film on the sidewall insulating film,
wherein the interlayer insulating film extends to a bottom of the deep trench.

3. The semiconductor device according to claim 2, wherein the sidewall insulating film includes a first sidewall insulating film and a second sidewall insulating film, and the second sidewall insulating film is formed on the first sidewall insulating film and in direct contact with the first sidewall insulating film.

4. The semiconductor device according to claim 2, wherein the sidewall insulating film comprises a HLD film, a TEOS film, a SOG film or a BPSG film, and the interlayer insulating film comprises a BPSG film.

5. The semiconductor device according to claim 2, wherein the sidewall insulating film contacts a thermal oxide film formed on the deep trench.

6. The semiconductor device according to claim 1, further comprising:
a drain region in the deep well region; and
a contact region in the body region.

7. The semiconductor device according to claim 6, further comprising:
an isolation region formed between the contact region and the deep trench.

8. The semiconductor device according to claim 7, wherein the isolation region comprises a local oxidation of silicon (LOCOS) or a shallow trench.

9. The semiconductor device according to claim 1, further comprising:
a protection layer comprising an insulating film and an etching stopper film formed over the substrate, the insulating film and the etching stopper film comprising an oxide or a nitride.

10. The semiconductor device according to claim 1, wherein a depth of the deep trench is greater than a depth of the deep well region.

11. The semiconductor device according to claim 1, further comprising:
a first well region and a second well region in the deep well region.

12. The semiconductor device according to claim 1, further comprising a buried layer disposed below the deep well region,
wherein the deep trench is in direct contact with the deep well region and the buried layer.

13. The semiconductor device according to claim 1, wherein the deep well region comprises a low dopant density well region and a high dopant density well region having a dopant density higher than that of the low dopant density well region.

14. The semiconductor device according to claim 1, wherein the support has a width smaller than a width of each of the two adjacent semiconductor devices in a direction parallel to a surface of the substrate.

15. The semiconductor devices according to claim 1, wherein a portion of the deep well region disposed adjacent to the deep trench has a higher dopant density than a portion of the deep well region disposed around the body region.

16. A semiconductor device comprising:
a substrate having an upper surface;
a source region and a drain region in the substrate;
a gate electrode disposed between the source region and the drain region;
a first insulation film formed over the gate electrode, the source region, and the drain region;
a deep trench formed in the first insulation film and the substrate;
a sidewall insulating film formed on a side surface of the deep trench, the sidewall insulating film being thicker at an upper portion of the deep trench than at a middle portion of the deep trench; and
an interlayer insulating film formed over the sidewall insulating film and the gate electrode.

17. The semiconductor device according to claim 16, wherein the sidewall insulating film contacts a thermal oxide film formed on the deep trench.

18. The semiconductor device according to claim 16, wherein a distance between the sidewall insulating film at the upper portion of the deep trench is smaller than a distance between sidewall insulating film at the middle portion of the deep trench.

19. The semiconductor device according to claim 16, further comprising:
a silicide layer formed over the gate electrode,
wherein the first insulation film is in contact with the silicide layer and is disposed on a region between the deep trench and the gate electrode.

20. The semiconductor device according to claim 16, further comprising:
a second insulation film formed over the first insulation film,
wherein the sidewall insulating film is in contact with the first insulation film, the second insulation film, and the interlayer insulating film.

21. The semiconductor device according to claim 16, further comprising:
an air gap within the deep trench,
wherein the air gap is located lower than the upper surface of the substrate.

22. The semiconductor devices according to claim 16, further comprising:
a deep well region formed in the substrate; and
a body region formed in the deep well region;
wherein a portion of the deep well region disposed adjacent to the deep trench has a higher dopant density than a portion of the deep well region disposed around the body region.

23. A semiconductor device comprising:
a substrate of a first conductivity type;
a second conductivity type buried layer disposed in the substrate;
a second conductivity type low dopant density well region disposed on the second conductivity type buried layer, and high dopant density well regions of a second conductivity type disposed at left and right sides of the second conductivity type low dopant density well region,
wherein each of the high dopant density well regions has a dopant density higher than that of the second conductivity type low dopant density well region, and the high dopant density well regions are in direct contact with the second conductivity type low dopant density well region and the second conductivity type buried layer;
a body region in the second conductivity type low dopant density well region;
a source region in direct contact with the body region, wherein the body region has a first conductivity type and the source region has a second conductivity type;
a gate electrode on the substrate, wherein the gate electrode overlaps with the body region; and
a deep trench in the substrate,
wherein the deep trench is in direct contact with the high dopant density well regions and the second conductivity type buried layer.

24. The semiconductor device according to claim 23, further comprising:
a sidewall insulating film on a side surface of the deep trench; and
a second conductivity type first well region and a second conductivity type second well region in the substrate,
wherein sidewall insulating film contacts a thermal oxide film formed on the deep trench.

25. The semiconductor device according to claim 24, wherein a depth of the deep trench is greater than a depth of the first well region or the second well region.

26. The semiconductor device according to claim 24, wherein the sidewall insulating film includes a first sidewall insulating film and a second sidewall insulating film, and the second sidewall insulating film is formed on the first sidewall insulating film and in direct contact with the first sidewall insulating film.

27. A semiconductor device comprising:
a substrate;
a source region and a drain region in the substrate;
a gate electrode disposed between the source region and the drain region;
an etch stopper film formed over the gate electrode, the source region, and the drain region;
an oxide insulating film formed over the etch stopper film;
a deep trench formed in the oxide insulating film, the etch stopper film, and the substrate;
a sidewall insulating film disposed on a side surface of the deep trench, a distance between the sidewall insulating film at an upper portion of the deep trench being smaller than a distance between the sidewall insulating film at an intermediate portion of the deep trench; and
an interlayer insulating film formed over the sidewall insulating film and the gate electrode.

28. The semiconductor device according to claim 27, wherein a thickness of the sidewall insulating film is greater at the upper portion of the deep trench than at the intermediate portion of the deep trench.

29. The semiconductor device according to claim 27, wherein the sidewall insulating film is in contact with the etch stopper film, the oxide insulating film, and the interlayer insulating film.

* * * * *

UNITED STATES PATENT AND TRADEMARK OFFICE
CERTIFICATE OF CORRECTION

PATENT NO.         : 10,395,972 B2
APPLICATION NO.    : 15/872747
DATED              : August 27, 2019
INVENTOR(S)        : Da Soon Lee et al.

It is certified that error appears in the above-identified patent and that said Letters Patent is hereby corrected as shown below:

In the Claims

In Claim 1, Column 13:
Line 1, should read --- a support formed between air gaps respectively formed ---

Signed and Sealed this
Eleventh Day of October, 2022

Katherine Kelly Vidal
*Director of the United States Patent and Trademark Office*